(12) United States Patent
Kondo

(10) Patent No.: US 10,395,739 B2
(45) Date of Patent: Aug. 27, 2019

(54) SEMICONDUCTOR MEMORY DEVICE WITH PLURALITY OF WRITE LOOPS INCLUDING WRITE AND VERIFY OPERATIONS

(71) Applicant: Toshiba Memory Corporation, Tokyo (JP)

(72) Inventor: Shigeo Kondo, Yokkaichie Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/918,351

(22) Filed: Mar. 12, 2018

(65) Prior Publication Data
US 2018/0277222 A1 Sep. 27, 2018

(30) Foreign Application Priority Data
Mar. 27, 2017 (JP) .................................. 2017-061752

(51) Int. Cl.
| | | |
|---|---|---|
| G11C 16/10 | (2006.01) |
| G11C 16/08 | (2006.01) |
| G11C 16/04 | (2006.01) |
| G11C 16/34 | (2006.01) |
| G11C 16/26 | (2006.01) |

(52) U.S. Cl.
CPC .......... *G11C 16/10* (2013.01); *G11C 16/0408* (2013.01); *G11C 16/0483* (2013.01); *G11C 16/08* (2013.01); *G11C 16/26* (2013.01); *G11C 16/3459* (2013.01)

(58) Field of Classification Search
CPC ..... G11C 16/10; G11C 16/26; G11C 16/0483; G11C 16/0408; G11C 16/08; G11C 16/3459
See application file for complete search history.

(56) References Cited

U.S. PATENT DOCUMENTS

| 7,768,836 B2 | 8/2010 | Li et al. |
| 8,310,870 B2 | 11/2012 | Dutta et al. |
| 2012/0257456 A1* | 10/2012 | Komatsu ............. G11C 11/5628 365/185.22 |
| 2017/0162272 A1* | 6/2017 | Kavalipurapu .... G11C 16/3459 |

FOREIGN PATENT DOCUMENTS

JP         2013-532881 A        8/2013

\* cited by examiner

*Primary Examiner* — Harry W Byrne
*Assistant Examiner* — Sultana Begum
(74) *Attorney, Agent, or Firm* — Finnegan, Henderson, Farabow, Garrett & Dunner, L.L.P.

(57) ABSTRACT

According to an embodiment, a semiconductor memory device includes a plurality of word lines, a plurality of bit lines, a plurality of memory cells, a word line driving circuit, a sense amplifier circuit, and a controller. The memory cell connected to the selected word line is written with data using a write sequence including a plurality of write loops each including a write operation of applying a write voltage to the selected word line by the word line driving circuit and a verify operation of detecting data of the memory cell by the sense amplifier circuit.
The controller determines an (n+k)-th (where n is an integer not less than 1 and k is an integer not less than 2) verify operation based on comparison between an n-th verify operation and an (n+1)-th verify operation in the write sequence.

14 Claims, 13 Drawing Sheets

SEMICONDUCTOR MEMORY DEVICE WITH PLURALITY OF WRITE LOOPS INCLUDING WRITE AND VERIFY OPERATIONS

CROSS-REFERENCE TO RELATED APPLICATIONS

This application is based upon and claims the benefit of priority from Japanese Patent Application No. 2017-061752, filed on Mar. 27, 2017; the entire contents of which are incorporated herein by reference.

FIELD

Embodiments of the invention relate generally to a semiconductor memory device.

BACKGROUND

In nonvolatile semiconductor memory devices such as NAND electrically erasable programmable read-only memories (EEPROMs), a cell-to-cell interference effect (proximal interference effect) increases with shrink of the nonvolatile semiconductor memory devices. A threshold distribution of a memory cell spreads by the inter-cell interference effect in some cases. On the other hand, a multi-valued memory cell such as a multi level cell (MLC) has been proposed. Since a threshold range of each value is relatively narrow in the MLC, a threshold distribution of a memory cell is preferably as narrow as possible. However, when the threshold distribution of the memory cell spreads by the cell-to-cell interference effect, it is difficult to put the threshold distribution of the memory cell within a threshold range of the MLC. In consideration of the cell-to-cell interference effect, a write time is lengthened when the threshold distribution of the memory cell is narrowed.

DETAILED DESCRIPTION

Figure 1:
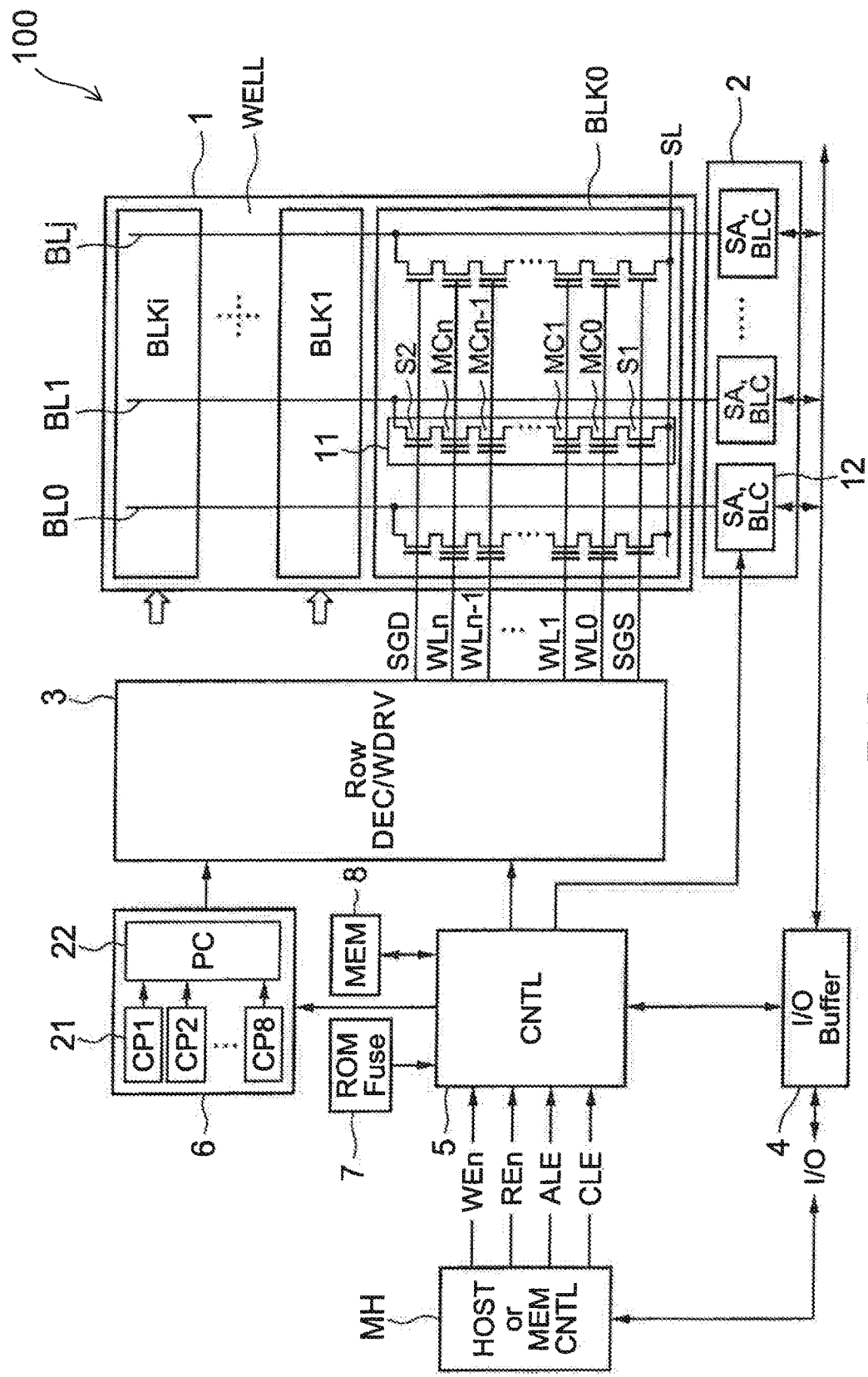
FIG. 1 is a plan view showing a semiconductor memory device according to an embodiment.

According to an embodiment, a semiconductor memory device includes a plurality of word lines, a plurality of bit lines, a plurality of memory cells, a word line driving circuit, a sense amplifier circuit, and a controller. The plurality of memory cells are provided to correspond to intersections of the word lines and the bit lines. The word line driving circuit applies a voltage to a selected word line among the plurality of word lines. The sense amplifier circuit detects data of the memory cells. The controller controls the word line driving circuit and the sense amplifier circuit. The memory cell connected to the selected word line is written with data using a write sequence including a plurality of write loops each including a write operation of applying a write voltage to the selected word line by the word line driving circuit and a verify operation of detecting data of the memory cell by the sense amplifier circuit. The controller determines an (n+k)-th (where n is an integer not less than 1 and k is an integer not less than 2) verify operation based on comparison between an n-th verify operation and an (n+1)-th verify operation in the write sequence.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described thereinabove are marked with like reference numerals, and a detailed description is omitted as appropriate.

(Embodiment)

FIG. 1 is a diagram showing an example of a configuration of a semiconductor memory device of an embodiment. A semiconductor memory device 100 of the embodiment is, for example, a NAND EEPROM.

In the specification, two directions which are parallel to an upper surface of a semiconductor substrate 101 (see FIG. 2) and are perpendicular to each other are referred to as an X-direction and a Y-direction. A direction perpendicular to both the X-direction and the Y-direction is referred to as a Z-direction.

As shown in FIG. 1, the semiconductor memory device 100 includes a memory cell array 1, a sense amplifier circuit 2, a row decoder 3, an input and output (I/O) buffer 4, a controller 5, a voltage generation circuit 6, a ROM fuse 7, and a data storage circuit 8.

The memory cell array 1 includes a plurality of memory blocks BLK0 to BLKi (where i is an integer not less than 2) formed on the same well. Each memory block BLK is configured such that a plurality of NAND cell units 11 extending in the Y-direction are arranged in the X-direction. Each NAND cell unit 11 includes a plurality of memory cells MC0 to MCn (where n is an integer not less than 1: for example, n=63) connected in series and select transistors S1 and S2 connected to both ends of the memory cells MC0 to MCn.

The memory cell MC is provided at an intersection of a word line WL and a bit line BL and may be one of a single-level cell (SLC), a multi-level cell (MLC), a triple-level cell (TLC), a quadruple-level cell (QLC), and higher-level cells.

In FIG. 1, word lines WL0 to WLn and select gate lines SGS and SGD of the memory block BLK0 are shown. The word lines WL0 to WLn are respectively connected to control gates of the memory cells MC0 to MCn and extend in the X-direction. The select gate lines SGS and SGD are respectively connected to gates of the select transistors S1 and S2 and extend in the X-direction. The word lines WL0 to WLn and the select gate lines SGS and SGD are shared by the plurality of NAND cell units 11 adjacent in the X-direction.

A source of each select transistor S1 in the memory block BLK0 is connected to the same source line SL. A drain of each select transistor S2 in the memory block BLK0 is connected to corresponding bit lines BL0 to BLj (where j is an integer not less than 2). As shown in FIG. 1, the source line SL extends in the X-direction and the bit lines BL0 to BLj extend in the Y-direction.

The sense amplifier circuit 2 includes a sense amplifier SA and a bit line controller BLC. The sense amplifier SA is a circuit that reads data from the memory cells MC through the bit lines BL0 to BLj. The sense amplifier SA compares a voltage in accordance with the data of the memory cells MC to a reference voltage and detects logic of the data. The bit line controller BLC selectively drives one bit line BL or the plurality of bit lines BL among the plurality of bit lines BL in accordance with an address received from the controller 5. The bit line controller BLC executes write controlling, a verify-read operation and a read operation by controlling the voltages of the selected bit lines BL.

For example, the sense amplifier circuit 2 detects data stored in the selected memory cells MC connected to the selected word lines WL and the selected bit lines BL in the verify-read operation and the read operation. The sense amplifier circuit 2 further includes a data latch circuit (not shown) and can temporarily retain the data detected in the sense amplifier SA.

The row decoder 3 (a word line driving circuit) is a circuit that selects one of the word line and the select gate line and applies a voltage to the word line or the select gate line.

The input and output (I/O) buffer 4 is a circuit that exchanges data between the sense amplifier circuit 2 and an external input and output terminal and receives command data or address data from the controller 5.

The controller 5 is a control unit that executes various kinds of control on the memory cell array 1. For example, the controller 5 receives external control signals such as a write enable signal WEn, a read enable signal REn, an address latch enable signal ALE, a command latch enable signal CLE from a memory controller (MH) or a host externally provided. Thus, the controller 5 controls the row decoder 3, the sense amplifier circuit 2, the bit line controller BLC, and the like to execute a write operation, a read operation, an erasing operation, and the like.

The voltage generation circuit 6 includes a plurality of boosting circuits 21 and a pulse generation circuit 22. The voltage generation circuit 6 switches the number of boosting circuits 21 to be driven based on a control signal from the controller 5. The voltage generation circuit 6 adjusts a pulse width and a pulse height of a pulse voltage by controlling the pulse generation circuit 22.

The ROM fuse 7 is a storage unit that stores a set value of the pulse width or the pulse height of the pulse voltage at the time of writing or erasing. For example, the ROM fuse 7 stores a value of a write voltage (program voltage) Vpgm applied to the word line, an increase width (step-up width) ΔVpgm of the write voltage, a verify level, or the like in a write operation. The write voltage Vpgm, the step-up width ΔVpgm, and the verify level may be given from the outside of the semiconductor memory device 100.

The data storage circuit 8 is a rewritable nonvolatile storage circuit that stores various kinds of data used to control the memory cell array 1.

Figure 2:
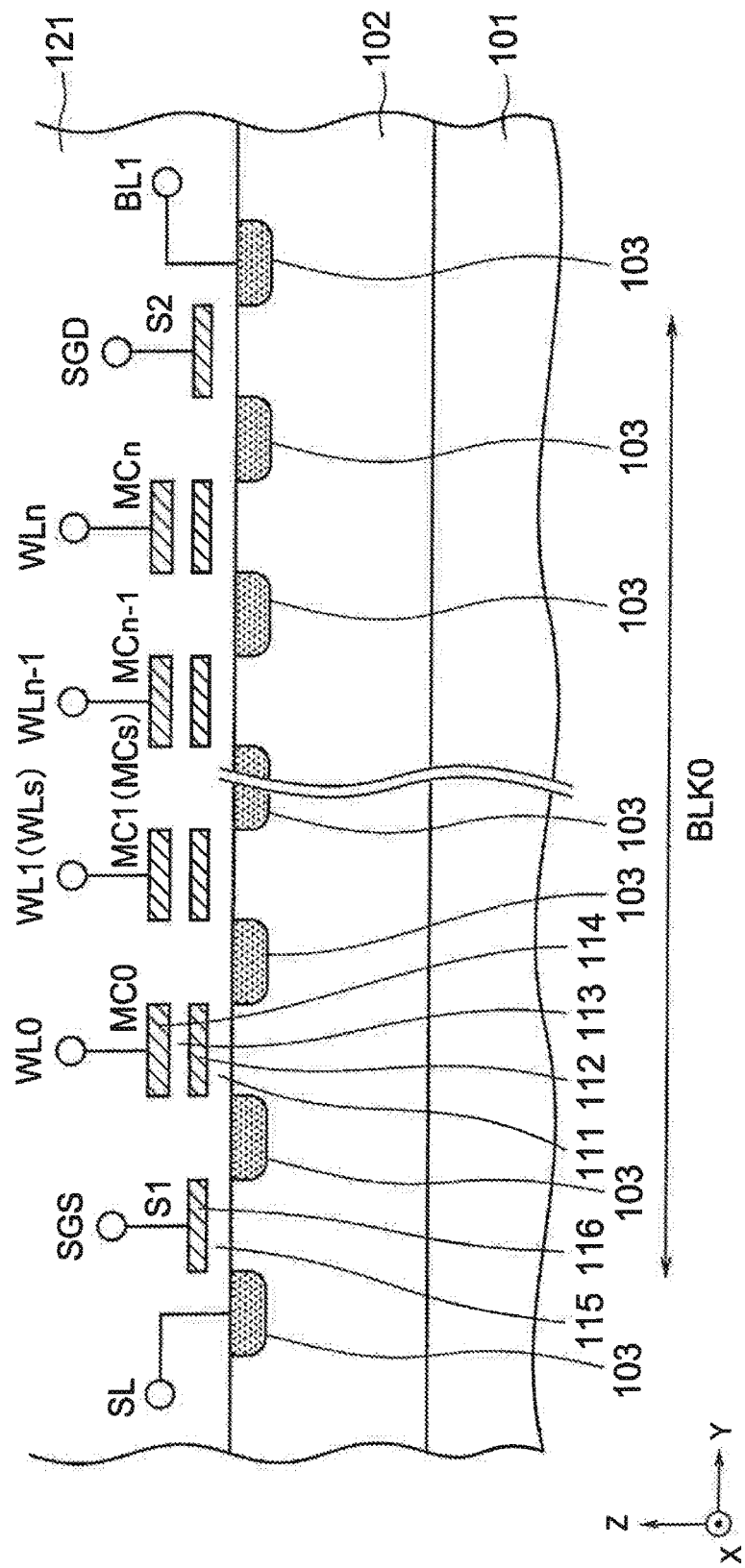
FIG. 2 is a sectional view showing a part of the semiconductor memory device according to the embodiment.

FIG. 2 is a sectional view showing an example of a configuration of the NAND cell unit 11.

As shown in FIG. 2, the NAND cell unit 11 includes the plurality of memory cells MC connected in series and two select transistors S1 and S2 connected to both ends of the memory cells MC. The select transistor S1 on a source side is connected to the source line SL and the select transistor S2 on a drain side is connected to the bit line BL.

The memory cells MC0 to MCn and the select transistors S1 and S2 are formed above a well 102 in the semiconductor substrate 101 and are connected in series by diffusion layers 103 in the well 102. The transistors are covered with an inter-layer insulating film 121.

The memory cell MC includes a charge storage layer (for example, a floating gate) 112 and a control gate 114. The charge storage layer 112 is provided above the semiconductor substrate 101 with a gate insulating film 111 between the charge storage layer 112 and the semiconductor substrate 101. The control gate 114 is provided above the charge storage layer 112 via an inter-gate insulating film 113 between the control gate 114 and the charge storage layer 112. The select transistors S1 and S2 each include a gate electrode 116 that is formed above the semiconductor substrate 101 with a gate insulating film 115 between the gate electrode 116 and the semiconductor substrate 101. The charge storage layer 112 is formed of a layer that has a charge storage function and is formed with, for example, a layer that contains silicon nitride in some cases.

The control gate 114 is connected to one of the word lines WL0 to WLn. The memory cell MC0 at one end of the NAND cell unit 11 is connected to the source line SL via the select transistor S1. The memory cell MCn at the other end of the NAND cell unit 11 is connected to the bit line BL via the select transistor S2. The numbers of word lines WL, bit lines BL, and memory cells MC are arbitrary.

Figure 3:
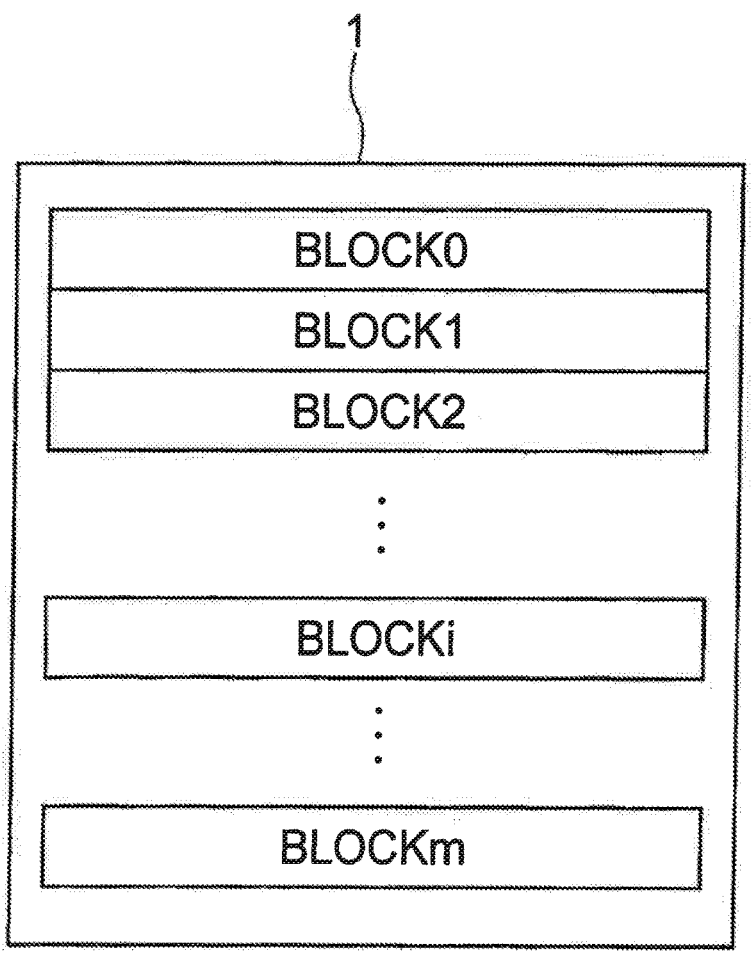
FIG. 3 is a diagram for describing a block and a page of a memory cell array.

FIG. 3 is a diagram for describing a block and a page of the memory cell array 1.

As shown in FIG. 3, the memory cell array 1 is divided into memory blocks (hereinafter also referred to as blocks) BLOCK0 to BLOCKm. In the example, each of the blocks BLOCK0 to BLOCKm is a minimum unit of data erasing. Each of the blocks BLOCK0 to BLOCKm includes a plurality of pages. The page is a unit of data reading or data writing. Each page corresponds to the word, line WL and is formed by data of a plurality of memory cells MC specified with certain addresses.

The NAND EEPROM executes a write operation and a read operation by the page. That is, the bit line controller BLC can simultaneously control the bit lines BL in the page. The sense amplifier circuit 2 detects data of the memory cell MC via the bit line BL.

Hereinafter, a data write operation of the semiconductor memory device 100 of the embodiment will be described.

Figure 4:
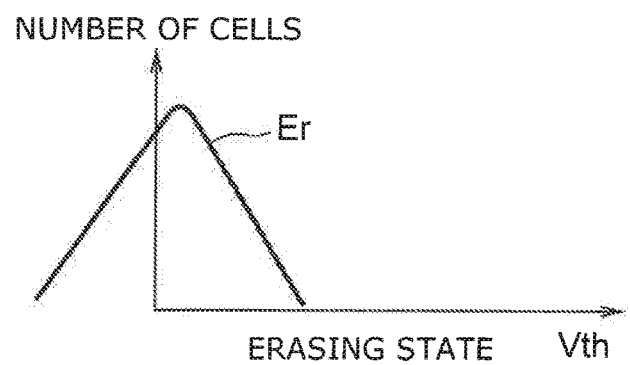
FIG. 4 is a graph showing a threshold distribution indicating each stage of a write sequence.
Figure 5:
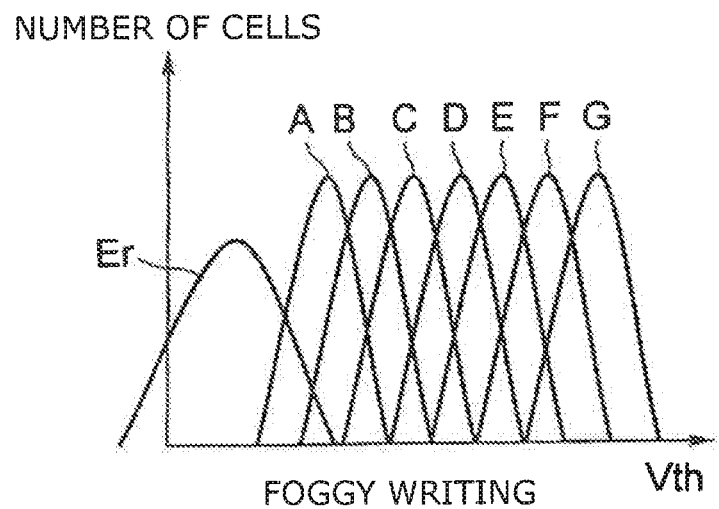
FIG. 5 is a graph showing a threshold distribution indicating each stage of a write sequence.
Figure 6:
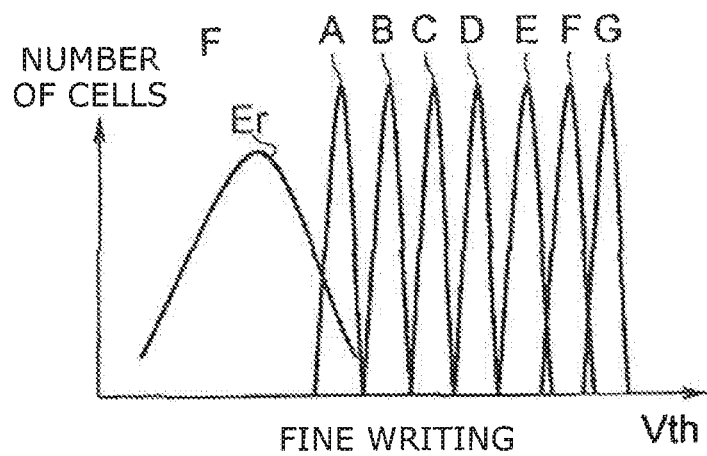
FIG. 6 is a graph showing a threshold distribution indicating each stage of a write sequence.

FIGS. 4 to 6 show threshold distributions of each stage of a write sequence in which 3-bit data is written on a certain write target word line. The vertical axis of the graph represents the number of memory cells MCs on the selected word lines WLs and the horizontal axis of the graph represents a threshold voltage Vth of the memory cells MCs on the selected word lines WLs, The vertical axis presents a logarithm indication.

In the semiconductor memory device 100 of the embodiment, 3-bit data is written on the memory cell MC in, for example, a "foggy-fine" scheme from an initial state. The initial state is equivalent to an erasing state of all the memory cells MC in the block BLOCK (which is also referred to as an Er state). The foggy-fine scheme is a write scheme of writing data in each state with high precision by fine writing after the data of each state is roughly written by foggy writing. Further, before foggy writing, lower middle (LM) writing in which a predetermined state is written may be executed temporarily.

FIG. 4 shows a threshold distribution of the memory cells MCs on the selected word lines WLs in the initial state. All of the memory cells MC in the block BLOCK enter an erased state by block erasing. Accordingly, a threshold voltage of the memory cell MC in the block BLOCK is in the lowest Er state in logic data. The state indicates an order of threshold voltage regions corresponding to stored data. Hereinafter, Er<A<B<C<D<E<F<Gisassumed.

FIG. 5 shows the threshold distribution of the memory cells MCs on the selected word lines WLs in the foggy writing. In the foggy writing, a plurality of pages including a lower page, a middle page, and an upper page are simultaneously written.

FIG. 6 shows the threshold distribution of the memory cells MCs on the selected word lines WLs in the fine writing. In the fine writing, a plurality of pages including the lower page, the middle page, and the upper page are simultaneously written.

That is, the writing of the plurality of pages includes the foggy writing shown in FIG. 5 and the fine writing shown in FIG. 6. Through the foggy writing, the memory cells MCs on the selected word lines WLs, which are initially in the Er-state, are written to one state among the Er, A, B, C, D, E, F and G-states to some extent, that is, close to and slightly below the final threshold voltages shown in FIG. 6, but the threshold distribution is broader and rougher than the fine writing. Thus, foggy-state word lines are usually unreadable.

Here, the data write operation of the semiconductor memory device 100 of the embodiment will be further described.

The data write operation (write sequence) is executed by iterating a write loop including a write operation and a verify-read operation. The write operation is an operation of writing data by applying a write voltage to the selected word lines WLs and increasing the threshold voltage of the selected memory cell. The verify-read operation is an operation of verifying whether the threshold voltage of the selected memory cell reaches a verify level, that is, whether desired data is written enough on the selected memory cell.

The selected memory cell refers to a memory cell connected to the selected word lines WLs and a memory cell in a selection state on the selected word lines WLs. For example, in FIG. 1, when the selected memory cell is set to MC1, the selected memory cell is connected to the selected word line WL1. In the embodiment, the write operation and the verify-read operation are executed in both the foggy writing and the fine writing.

Whenever the write loop is iterated in the write sequence, the controller 5 increases a voltage of the selected word line by ΔVpgm (step-up). Thus, the threshold voltage of the selected memory cell connected to the selected word line increases by substantial ΔVpgm whenever the write loop is executed.

When the threshold voltage of the selected memory cell gradually increases, the threshold voltage of the selected memory cell gradually approaches the verify level (reference voltage) and reach any verify level in the verify-read operation. At this time, the selected memory cell passes (succeeds in) verifying. When the selected memory cell passes the verifying, writing on the selected memory cell ends and the bit line BL corresponding to the selected memory cell enters an unselected state (write inhibition). For example, the bit line controller BLC increases the voltage of the bit line corresponding to the selected memory cell which has passed the verifying and fixes the voltage. Even when a write voltage is applied to the selected word line, a voltage to be applied to the selected memory cell is lowered. Thus, in a subsequent write loop, no data is written any longer on the selected memory cell which has passed the verifying. Accordingly, the threshold voltage of the selected memory cell distributes over or near the verify level (reference voltage).

The selection state is a state (write permission state) in which the voltage of the bit line is lowered so that the voltage applied to the selected memory cell is not lowered when the write voltage is applied to the selected word line. The unselected state is a state (write inhibition state) in which the voltage of the bit line is fixed so that the voltage applied to the memory cell is lowered even when the write voltage is applied to the selected word line.

The write sequence is controlled by the controller 5, the sense amplifier circuit 2, and the row decoder 3. The write sequence is executed in order of the word lines WL0, WL1, . . . , WLn−1, and WLn.

Hereinafter, an example of the fine writing according to the embodiment will be described.

Figure 7:
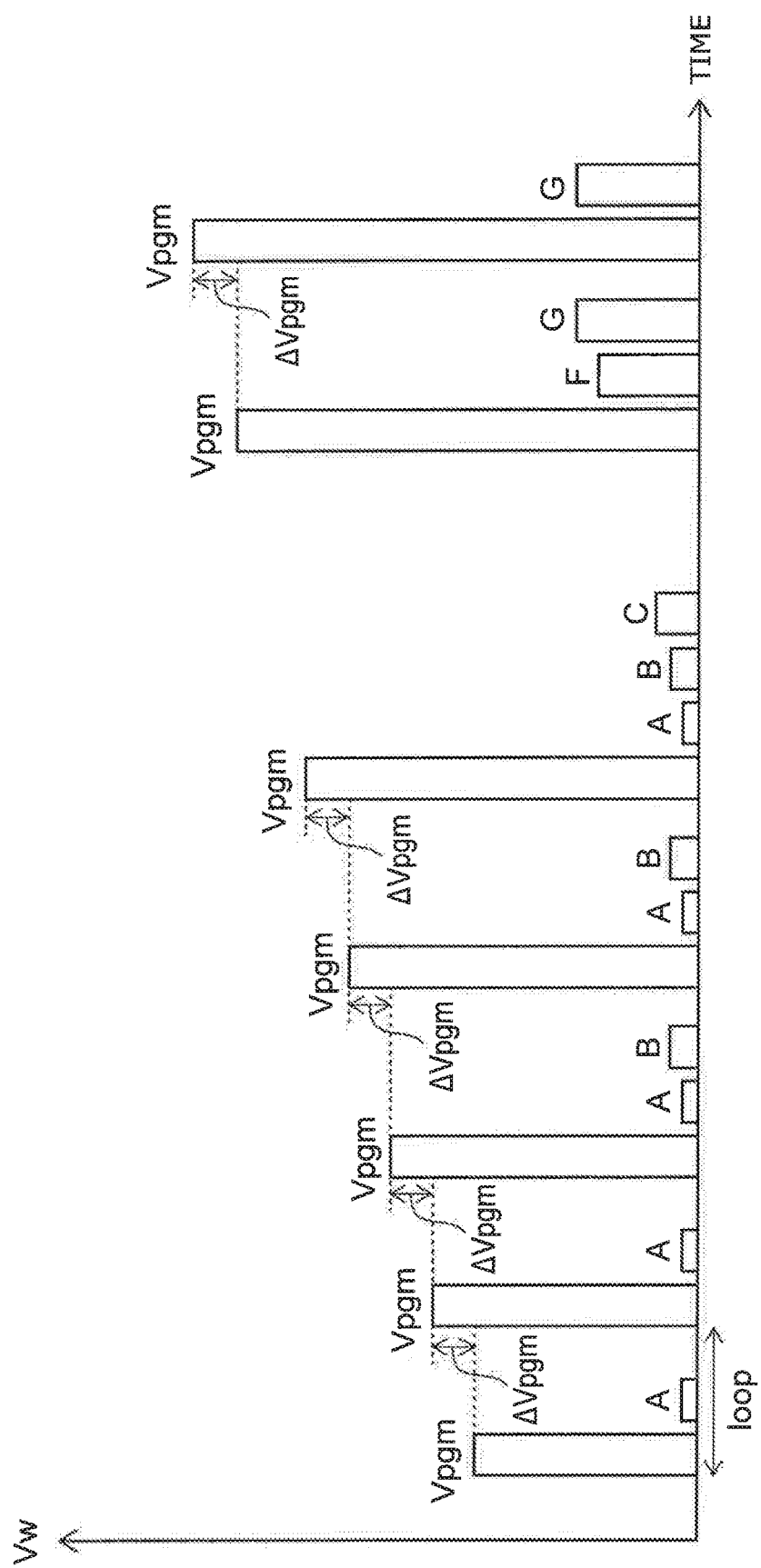
FIG. 7 is a graph showing a word line voltage in a fine writing.

FIG. 7 shows a word line voltage Vw in the fine writing after the foggy writing in the embodiment. The vertical axis represents the word line voltage Vw and the horizontal axis represents a time. The write loop is indicated as a loop.

In the fine writing of the embodiment, in the verify-read operation of first and second write loops in the example of FIG. 7, the verify-read operation for the A state higher by one stage than the Er state is executed on all the selected memory cells in which the A to G states are written. Conversely, the verify-read operation for the B to G states other than the A state is not executed.

Then, after a predetermined number of write loops, in the verify-read operation of third and fourth write loops in the example of FIG. 7, the verify-read operation in the A state and the B state higher by two stages than the Er state is executed on all the selected memory cells in which the A to G states are written. Conversely, the verify-read operation for the C to G states other than the A and B states is not executed.

Further, after the predetermined number of write loops, in the verify-read operation of the fifth write loop in the example of FIG. 7, the verify-read operation for the A and B states and the C state higher by three states than the Er state is executed on all the selected memory cells in which the A to G states are written. Conversely, the verify-read operation for the D to G states other than the A to C states is not executed.

That is, in the first and second write loops, the controller 5 executes the verify-read operation for the A state and does not execute the verify-read operation for the B to G states after executing the writing on the selected memory cells at the write voltage Vpgm. Thereafter, in the third and fourth write loops, the controller 5 executes the verify-read operation for the A and B states and does not execute the verify-read operation for the C to G states after executing the writing on the selected memory cells at the write voltage Vpgm. Thereafter, in the fifth write loop, the controller 5 executes the verify-read operation for the A to C states and does not execute the verify-read operation for the D to G states after executing the writing on the selected memory cells at the write voltage Vpgm.

The write sequence in which the verify-read operation is omitted in some of the states in this way is referred to as a verify-skip operation.

When the write loop is iteratively executed, the threshold voltage of the selected memory cell increases by the substantial step-up width $\Delta$Vpgm in association with the step-up of the voltage of the selected word lines WLs. Then, when the write state of the selected memory cell reaches a predetermined state, the controller 5 makes the selected memory cell to enter the unselected state.

After each write loop, the controller 5 verifies whether the threshold voltage of all the selected memory cells in which the verify-read operation is executed in the loop reaches the verify level of each state (the A to G states). Whether the threshold voltage of the selected memory cell reaches the verify level may be determined depending on whether a given current or more flows in the channel in the state in which an equal voltage is applied to the word line at the verify level. When the threshold voltage does not reach the verify level, the current flows (the gate is in the ON state). When the threshold voltage reaches the verify level, no current flows (the gate is in the OFF state). When the selected memory cell which has passed the verifying enters the unselected state, whether the threshold voltage reaches each state in the selected memory cell is not verified by the controller 5.

For example, when the threshold voltage of a certain selected memory cell reaches the A state, it is not necessary to execute the verify-read operation for the A state in the selected memory cell irrespective of the write state on the selected memory cell. In this case, the selected memory cell passes the verifying for the A state. The controller 5 executes the write operation on the selected memory cell reaching the verify level of the A state in the subsequent write loop in accordance with the write data, but does not set the selected memory cell as a verify-read operation target for the A state. Conversely, both the write operation and the verify-read operation of the write loop are executed on the selected memory cell which does not reach the A state.

Hereinafter, a threshold voltage state in the verify-skip operation will be described.

The verify-skip operation in the fine writing after foggy writing will be described below.

Figure 8:
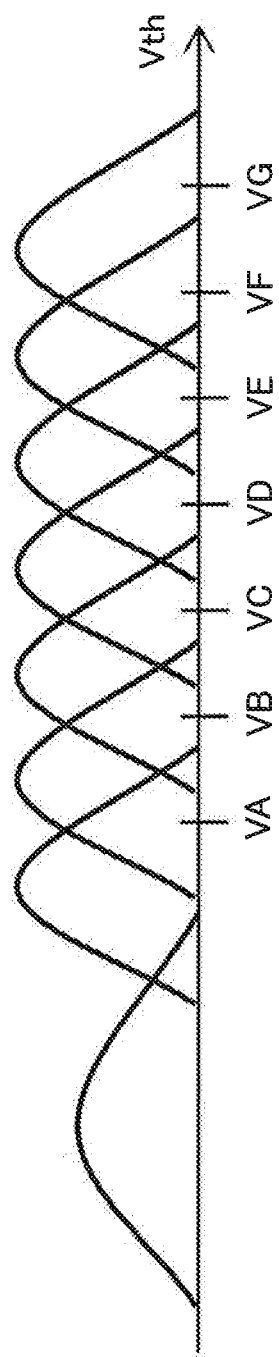
FIG. 8 is a diagram for describing a threshold voltage of a verify-read operation in the fine writing.

FIG. 8 shows a threshold distribution of the memory cells MCs on the selected word lines WLs in the initial state of the fine writing of FIG. 7.

Figure 9:
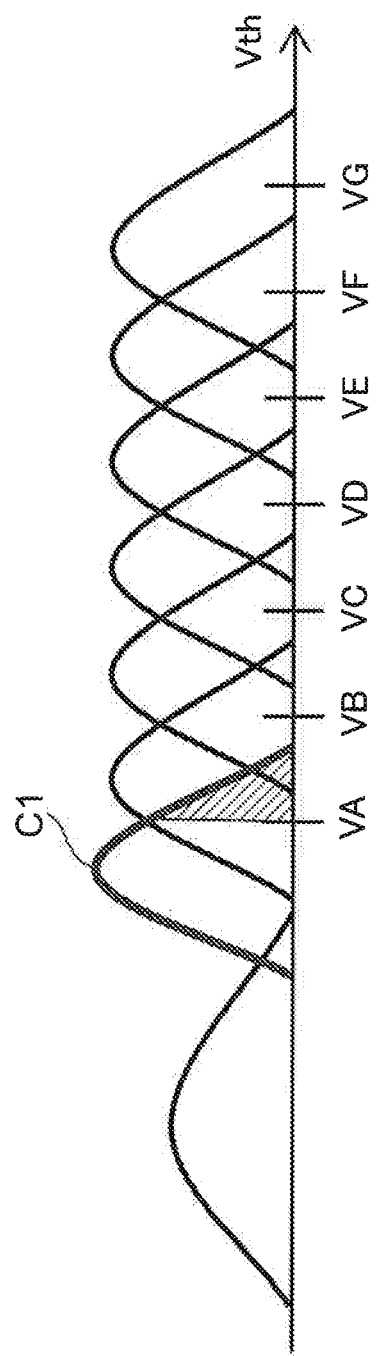
FIG. 9 is a diagram for describing a threshold voltage of the verify-read operation in the fine writing.

FIG. 9 shows a threshold distribution of the memory cells MCs on the selected word lines WLs after a first fine write loop of FIG. 7.

Figure 10:
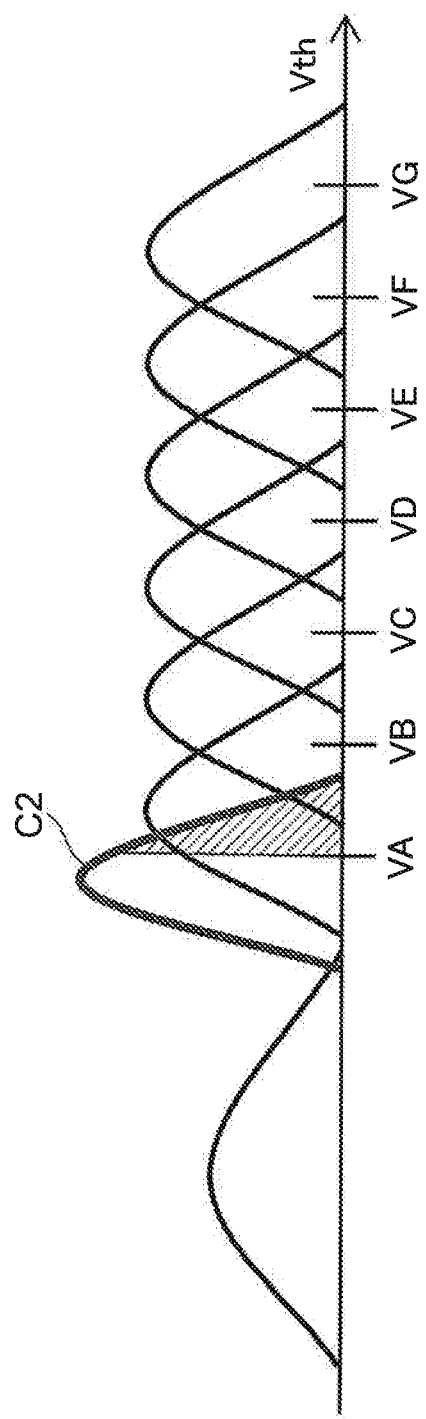
FIG. 10 is a diagram for describing a threshold voltage of the verify-read operation in the fine writing.

FIG. 10 shows a threshold distribution of the memory cells MCs on the selected word lines WLs after a second fine write loop of FIG. 7.

Figure 11:
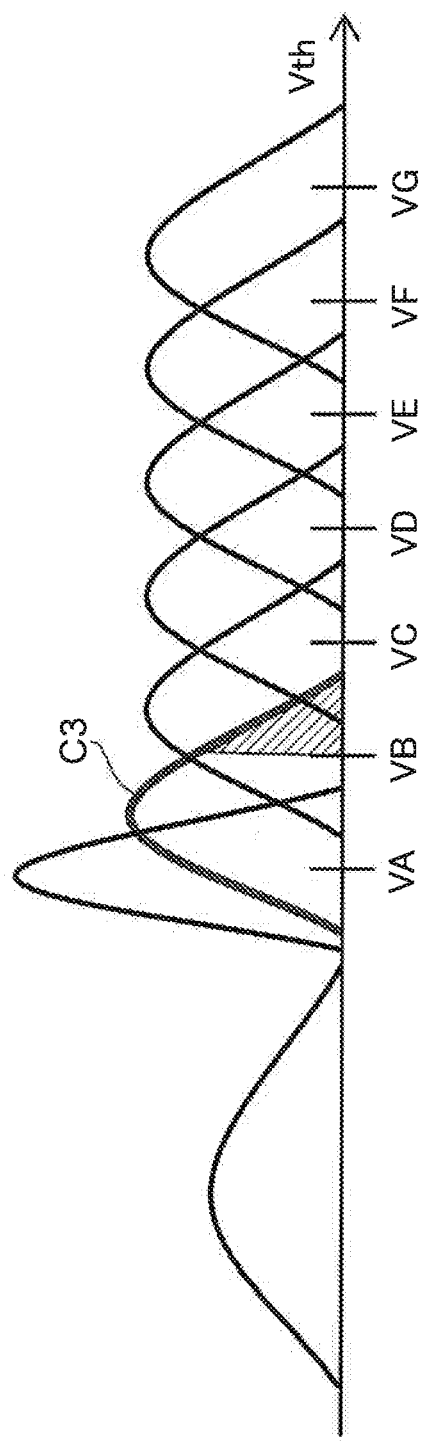
FIG. 11 is a diagram for describing a threshold voltage of the verify-read operation in the fine writing.

FIG. 11 shows a threshold distribution of the memory cells MCs on the selected word lines WLs after a third fine write loop of FIG. 7.

Figure 12:
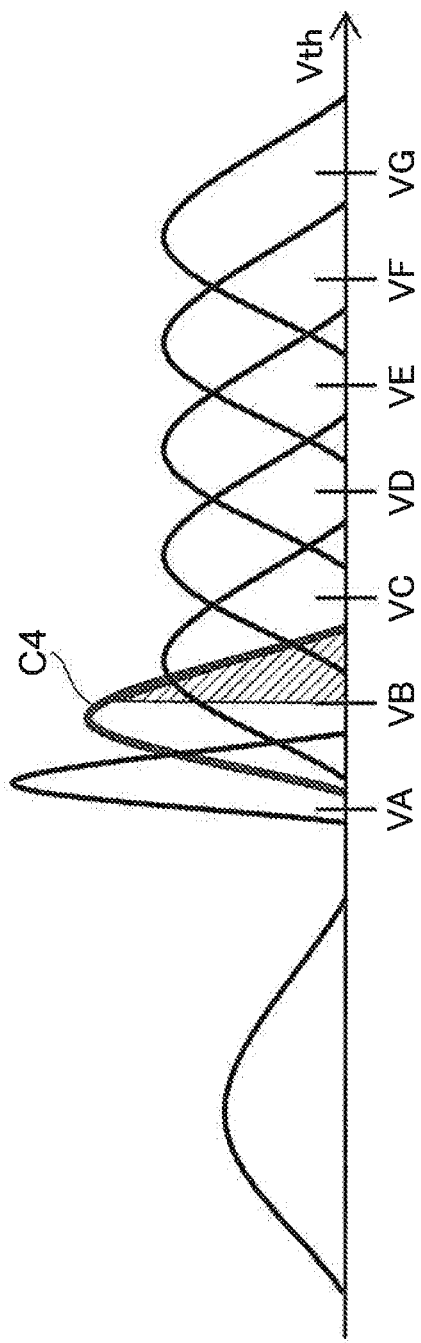
FIG. 12 is a diagram for describing a threshold voltage of the verify-read operation in the fine writing.

FIG. 12 shows a threshold distribution of the memory cells MCs on the selected word lines WLs after a fourth fine write loop of FIG. 7.

VA to VG in FIGS. 8 to 12 indicate verify levels (verify-read reference voltages) of the A to G states.

Figure 13:
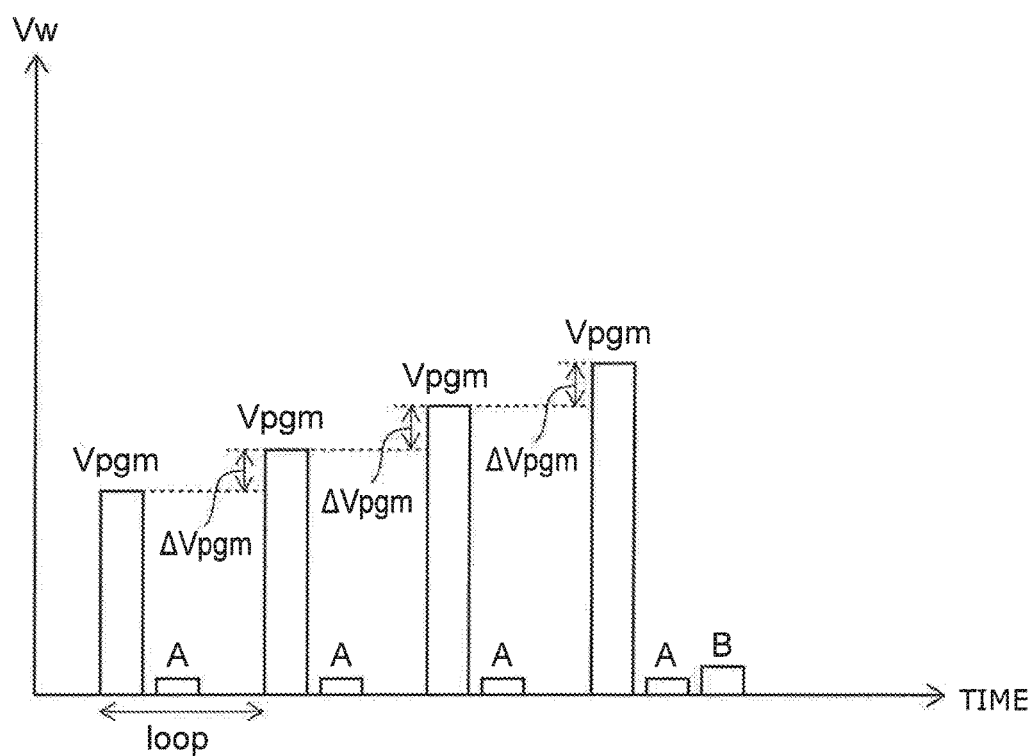
FIG. 13 is a graph showing a word line voltage in the fine writing according to a modification example of the embodiment.

FIG. 13 shows a word line voltage Vw in fine writing after foggy writing according to a modification example.

As shown in FIG. 8, as described above, through the foggy writing, the memory cells MCs on the selected word lines WLs initially in the Er-state are written to one state among the Er, A, B, C, D, E, F and G-states to some extent, but the threshold distribution after foggy writing is broader and rougher than the fine writing. Accordingly, in the initial state of the fine writing, the threshold distribution of the memory cells MCs on the selected word lines WLs is equivalent to the distribution shown in FIG. 8. Some of the memory cells MCs on the selected word lines WLs pass the verify levels of the A to G states from the beginning of the fine writing.

As shown in FIG. 9, some of the memory cells MCs on the selected word lines WLs reach the verify level of the A state after the first fine write loop. The controller 5 detects the number of memory cells reaching the verify level of the A state after the first fine write loop. In the example shown in FIG. 9, the number of memory cells reaching the verify level VA of the A state after the first fine write loop is equivalent to a shaded portion in a curve C1.

As shown in FIG. 10, some of the memory cells MCs on the selected word lines WLs reach the verify level of the A state after the second fine write loop. The controller 5 detects the number of memory cells reaching the verify level of the A state after the second fine write loop. In the example shown in FIG. 10, the number of memory cells reaching the verify level VA of the A state after the second fine write loop is equivalent to a shaded portion in a curve C2.

The controller 5 detects the number of memory cells reaching the verify level of the A state between the first and second fine write loops. In the examples shown in FIGS. 9 and 10, the number of memory cells reaching the verify level VA of the A state between the first and second fine write loops is equivalent to a portion obtained by subtracting the shaded portion in the curve C1 of FIG. 9 from the shaded portion in the curve C2 of FIG. 10. This number of memory cells is nothing but the number of memory cells newly reaching the verify level VA of the A state after the second write loop.

The controller 5 compares the number of memory cells newly reaching the verify level of the A state to a threshold Ct1 of the number of memory cells. When the controller 5 concludes that the number of memory cells newly reaching the verify level of the A state is not less than the threshold Ct1 of the number of memory cells, as shown in FIG. 7, the controller 5 executes the verify-read operation for the A state and executes the verify-read operation for the B state after executing writing on the selected memory cells at the write voltage Vpgm in the third write loop.

When the controller 5 concludes that the number of memory cells newly reaching the verify level of the A state is less than the threshold Ct1 of the number of memory cells, the controller 5 executes the verify-read operation for the A state and does not execute the verify-read operation for the B state after executing writing on the selected memory cells at the write voltage Vpgm in the third write loop.

As shown in FIG. 11, some of the memory cells MCs on the selected word lines WLs reach the verify level of the B state after the third fine write loop. The controller 5 detects the number of memory cells reaching the verify level of the B state after the third fine write loop. In the example shown in FIG. 11, the number of memory cells reaching the verify level VB of the B state after the third fine write loop is equivalent to a shaded portion in a curve C3.

As shown in FIG. 12, some of the memory cells MCs on the selected word lines WLs reach the verify level of the B state after the fourth fine write loop. The controller 5 detects the number of memory cells reaching the verify level of the B state after the fourth fine write loop. In the example shown in FIG. 12, the number of memory cells reaching the verify level VB of the B state after the fourth fine write loop is equivalent to a shaded portion in a curve C4.

The controller 5 detects the number of memory cells reaching the verify level of the B state between the third and fourth fine write loops. In the examples shown in FIGS. 11 and 12, the number of memory cells reaching the verify level VB of the B state between the third and fourth fine write loops is equivalent to a portion obtained by subtracting the shaded portion in the curve C3 of FIG. 11 from the shaded portion in the curve C4 of FIG. 12. This number of memory cells is nothing but the number of memory cells newly reaching the verify level VB of the B state after the fourth write loop.

The controller 5 compares the number of memory cells newly reaching the verify level of the B state to a threshold Ct2 of the number of memory cells. When the controller 5 concludes that the number of memory cells newly reaching the verify level of the B state is not less than the threshold Ct2 of the number of memory cells, as shown in FIG. 7, the controller 5 executes the verify-read operation for the A and B states and executes the verify-read operation for the C state after executing writing on the selected memory cells MCs at the write voltage Vpgm in the fifth write loop.

When the controller 5 concludes that the number of memory cells newly reaching the verify level of the B state is less than the threshold Ct2 of the number of memory cells, the controller 5 executes the verify-read operation for the A and B states and does not execute the verify-read operation for the C state after executing writing on the selected memory cells at the write voltage Vpgm in the fifth write loop.

In this embodiment, when the number of memory cells (a difference between the number of cells already passing an m-th verify (where m is an integer not less than 2) and the number of cells already passing (m−1)-th verify) newly reaching the verify level of a state n (for example, the A and B states) through writing in an m-th write loop is not less than the threshold Ct (for example, Ct1 or Ct2) of the number of memory cells, a verify-read operation for the state (for example, the B or C state) higher by one stage than the state n in the (m+1)-th write loop is newly executed.

When the number of memory cells newly reaching the verify level of the state n is not less than the threshold Ct of the number of memory cells after the m-th write loop, the verify-read operation for a state higher by one stage than the state n from the write loop subsequent to the (m+2)-th write loop may be newly executed. For example, as shown in FIG. 13, the controller 5 determines that the number of memory cells newly reaching the verify level of the A state is not less than the threshold Ct1 of the number of memory cells after the second write loop. Then, the controller 5 executes the verify-read operation for the A state and executes the verify-read operation for the B state after executing writing on the selected memory cells at the write voltage Vpgm in the fourth write loop. When the number of memory cells newly reaching the verify level of the state n is not less than the threshold Ct, the verify-read operation for a state higher by two stages or more than the state n from the write loop subsequent to the (m+1)-th write loop may be newly executed.

The threshold Ct of the number of memory cells is stored in, for example, the ROM fuse 7 or the data storage circuit 8. The threshold Ct of the number of memory cells is an arbitrary value. The threshold Ct of the number of memory cells can be determined based on, for example, the number of memory cells MCs on the selected word lines WLs. For example, the threshold Ct of the number of memory cells is 1.0 or more percents of all the memory cells on the selected word lines WLs. When the threshold Ct of the number of memory cells is set in this way, the threshold of the number of memory cells can be set uniformly in the same method in a plurality of products in which the number of memory cells per word line is different. The threshold Ct of the number of memory cells may be a fixed value irrespective of a write state. That is, the threshold Ct1 of the number of memory cells may be the same as the threshold Ct2 of the number of memory cells.

Hereinafter, the memory cell passing the verify-read operation in the fine writing after the foggy writing will be described.

Figure 14A:
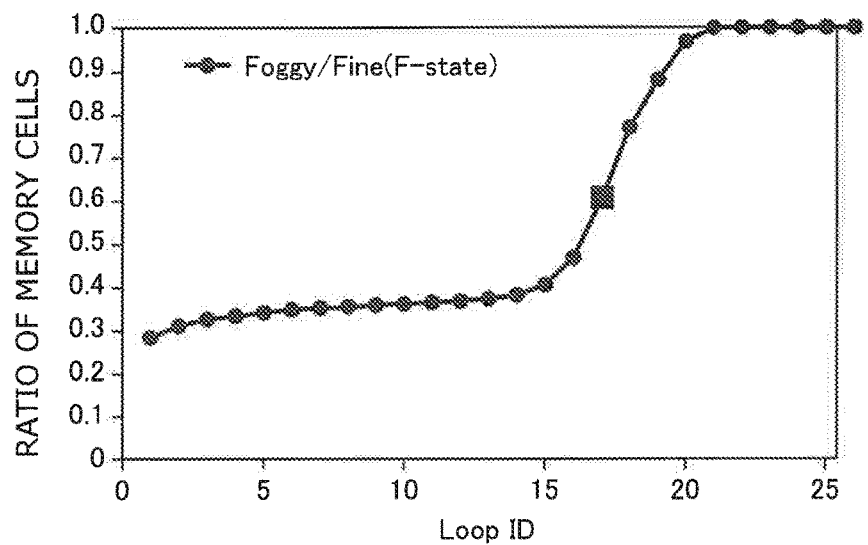
FIG. 14A is a diagram showing a ratio of cells passing the verify-read operation in the fine writing.
Figure 14B:
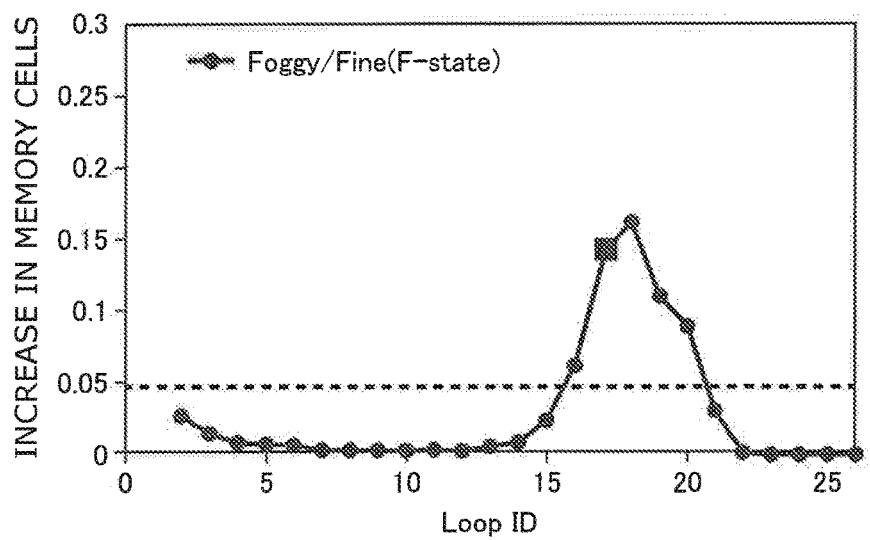
FIG. 14B is a diagram showing an increase in the cells passing the verify-read operation in the fine writing.

FIG. 14A shows a ratio of the cells passing the verify-read operation in the fine writing after the foggy writing. FIG. 14B is a diagram showing an increase in the cells passing the verify-read operation in the fine writing after the foggy writing.

FIGS. 14A and 14B illustrate examples of the memory cells passing the verify-read operation of the F state in the fine writing after the foggy writing. In FIG. 14A, the vertical axis represents a ratio of the memory cells that already passed the verify-read operation and the horizontal axis represents the number of write loops (loop number). In FIG. 14B, the vertical axis represents an increase in the memory cells that passed the verify-read operation and the horizontal axis represents the number of loops (loop number).

Therefore, the increase of the memory cells in FIG. 14B is equivalent to a difference of the ratio of the memory cells between the current loop and the immediately previous loop of the current loop in FIG. 14A.

As shown in FIGS. 14A and 14B, in the fine writing after the foggy writing, the ratio of the memory cells passing the verify-read operation for the F state is small and the increase in the memory cells is small in a stage in which the number of write loops is small.

Conversely, in a stage in which the number of write loops is large, the ratio of the memory cells passing the verify-read operation for the F state is large and the increase in the memory cell is large.

For example, the threshold Ct of the number of memory cells can be determined based on FIGS. 14A and 14B. For example, as indicated by a dotted line of FIG. 14B, at the threshold Ct of the number of memory cells for the F state, the verify-read operation for a G state subsequent to the F state is executed in the loop (17th write loop) subsequent to the loop (16th write loop) in which the increase value of the memory cells passing the verify-read operation for the F state becomes 0.05 or more. In the 17th write loop in which the verify-read operation for the G state is executed, the increase value of the memory cells is indicated by a square plot.

Hereinafter, an example of the fine write sequence after the foggy writing will be described.

Figure 15:
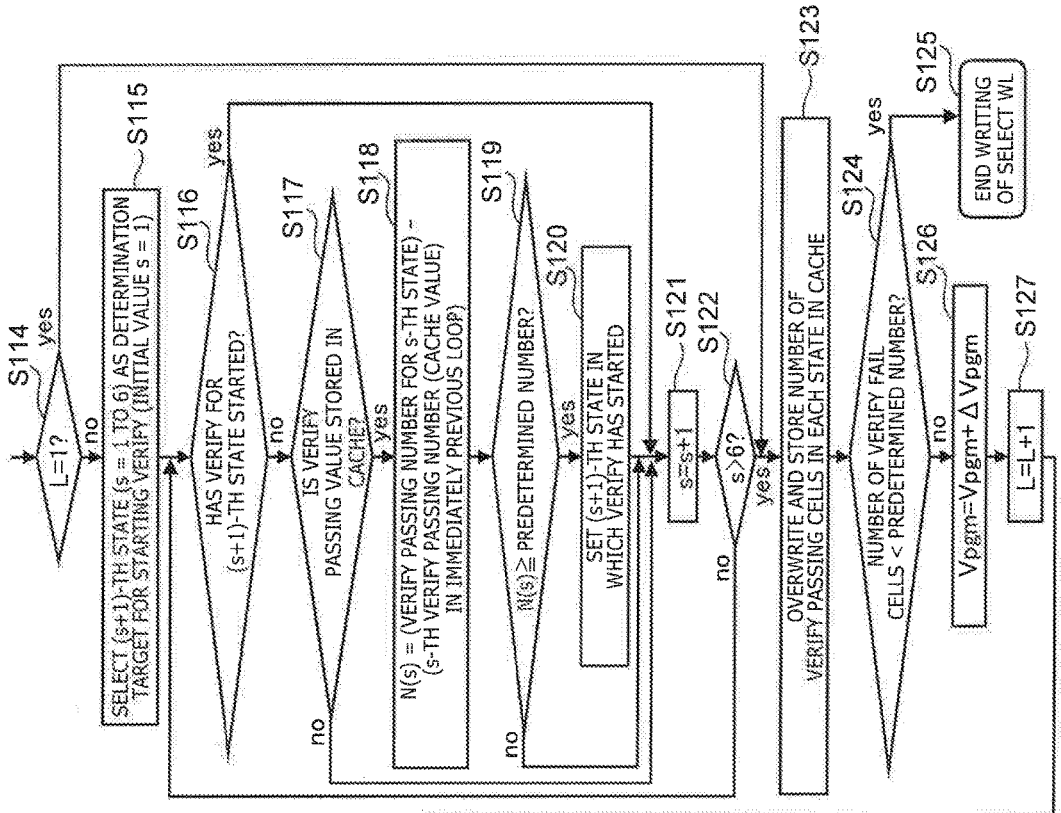
FIG. 15 is a flowchart illustrating an example of a fine write sequence according to the embodiment.
Figure 15:
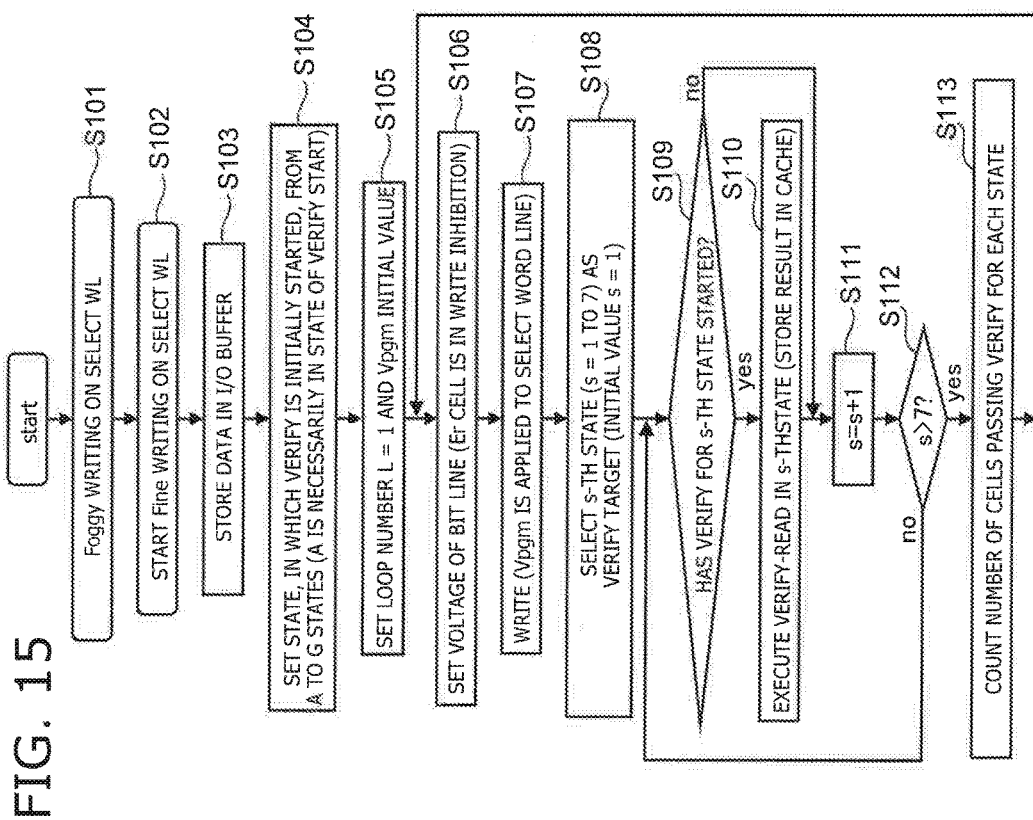

FIG. 15 is a flowchart illustrating an example of a fine write sequence according to the embodiment.

FIG. 15 shows the fine writing on the selected memory cell on a certain selected word lines WLs. The following determination operations in steps S are executed by, for example, the controller 5.

First, the foggy writing is executed on the memory cells MCs on the selected word lines WLs (S101). Subsequently, the fine writing on the selected memory cell on the selected word lines WLs is started (S102).

Subsequently, the data written on the selected memory cell on the selected word lines WLs is stored in the input and output (I/O) buffer 4 (S103).

Subsequently, one or more appropriate states are chosen among the A to G states as initial states for the verify-read operation to be executed for from the first write loop (S104). The verify-read operation for the A state is almost always executed from the first write loop.

Subsequently, the loop number L indicating the number of loops is set to 1 and the write voltage Vpgm is set to an initial value (S105).

Subsequently, the bit line controller BLC applies a low-level voltage (for example, a source voltage) to the selected bit lines BL (S106). The bit lines BL connected to the memory cell of the Er level are also fixed to a high-level voltage and enter the write inhibition state.

Subsequently, the row decoder 3 applies the write voltage Vpgm to the selected word line WL (S107). Thus, writing is executed on the selected memory cells connected to the selected bit lines BL and the selected word line WL.

Subsequently, an S-th (where S is an integer from 1 to 7) state is selected as a verify-read operation target to execute the verify-read operation on the selected memory cell (S108). The states S=1 to 7 correspond to the A to G states, respectively, and the initial value of S is set to 1 (the A state).

Subsequently, it is determined whether the verify-read operation for the S-th state has already started at a previous write loop (S109).

When the verify-read operation for the S-th state has already started (yes in S109), the verify-read operation for the S-th state is executed also in the current loop and the result of the verify operation is stored in the data storage circuit 8 or the like (S110).

Subsequently, the verify-read operation target is set to a state higher by one stage than the current state (S111). When the verify-read operation for the S-th state has not yet started in previous write loops (no in S109), the verify-read operation for the S-th state is skipped, and the verify-read operation target is set to the state higher by one stage than the current state.

Subsequently, it is determined whether S is greater than 7 (S112), where S is the state higher by one stage than the current state at this point.

When S is 7 or less (no in S112), steps S109 to S111 are repeated.

When S is greater than 7 (yes in S112), the number of memory cells passing the verify-read operation for each of the A to G states is counted (S113).

Subsequently, it is determined whether the loop number L is 1 (S114). When the loop number L is 2 or greater (no in S114), an (S+1)-th state is selected as a target of determination whether the verify-read operation for it should be started (S115).

When the loop number L is 1 (yes in S114), the number of memory cells passing the verify-read operation for each of the A to G states is stored in the data storage circuit 8 or the like (S123).

Subsequently, it is determined whether the verify-read operation for the (S+1)-th state has already started at a previous write loop (S116). When the verify-read operation for the (S+1)-th state has not started yet in previous write loops (no in S116), it is determined whether the number of the memory cells passing the previous verify-read operation is stored in the data storage circuit 8 or the like (S117).

When the number of the memory cells passing the previous verify-read operation is stored (yes in S117), N(s) equivalent to a value obtained by subtracting the number of memory cells passing the verify-read operation in the S-th state in the immediately previous write loop (for example, L=1) of the current write loop from the number of memory cells passing the verify-read operation in the S-th state in the current write loop (for example, L=2) is calculated (S118). N(s) is equivalent to, for example, an increase value of the memory cells in FIG. 14B. In the immediately previous write loop (for example, L=1) of the current write loop, the number of memory, cells passing the verify-read operation for the S-th state is stored in the data storage circuit 8 or the like.

Subsequently, it is determined whether or not N(s) is equal to or greater than a predetermined value (S119). The predetermined value is equivalent to, for example, the threshold Ct of the number of memory cells.

When N(s) is equal to or greater than the predetermined value (yes in S119), the (S+1)-th state is set to a state for which the verify-read operation has started (S120). In this case, the verify-read operation for the (S+1)-th state is executed in the subsequent write loop (for example, L=3).

Subsequently, the state higher by one stage than the current state is set as the target of determination whether the verify-read operation for it should be started (S121).

S121 is also done when the verify-read operation for the (S+1)-th state has already started (yes in S116), when the number of the memory cells passing the previous verify-read operation is not stored yet (no in S117), or when N(s) is less than the predetermined value (no in S119).

Subsequently, it is determined whether S is greater than 6 (S122), where S is the state higher by one stage than the current state at this point.

When S is greater than 6 (yes in S122), the number of memory cells passing the verify-read operation in each of the A to G states is stored in the data storage circuit 8 or the like (S123).

When S is 6 or less (no in S122), steps S116 to S121 are repeated.

Subsequently, it is determined whether the number of verify fail cells is less than a predetermined number (S124). When the number of verify fail cells is less than the predetermined number (yes in S124), the writing on the selected memory cell on the selected word lines WLs ends (S125).

When the number of verify fail cells is greater than the predetermined number (no in S124), the step-up width ΔVpgm is added to the current write voltage Vpgm and the value of (Vpgm+ΔVpgm) is set as a new write voltage Vpgm (S126).

Subsequently, the write sequence goes on to the next write loop (S127) and the bit line controller BLC applies a low-level voltage to the selected bit line BL (S106).

In this way, after each write loop including the write operation and the verify-read operation, the controller 5 determines whether the verify operation in the subsequent write loops is to be executed for higher states than the current verify-read target states by calculating the difference between the number of cells that passed verify-read operation at the current loop and the immediately previous loop and comparing it with the threshold value.

The threshold distribution shown in FIG. 6 can be obtained by iterating the write loops using the verify-skip operation.

Hereinafter, advantages of the embodiment will be described.

The semiconductor memory device 100 of the embodiment compares the results of the verify operations in an (m−1)-th (where m is an integer not less than 2) write loop and an m-th write loop, determines whether the number of memory cells newly reaching the verify level of the state n between the (m-1)-th and m-th write loops is not less than the threshold Ct of the number of memory cells, and determines whether the verify-read operation for the state higher by one stage than the state n in a write loop subsequent to the (m+1)-th write loop is newly executed. When the verify-skip operation is executed in the write operation, a speed of the write operation of the semiconductor memory device 100 is improved.

In the embodiment, in the verify-skip operation, a start reference of the verify-read operation for a high write state is equivalent to whether the number of memory cells newly reaching the verify level of the lower state between a previous write loop and a current write loop is not less than the threshold Ct of the number of memory cells. According to the reference, it is possible to simultaneously prevent the verify-read operation in the higher state from starting in the write loop of an unnecessarily early stage and from starting in the write loop of an excessively late stage even in the fine writing of the foggy-fine scheme. For example, when the start reference of the verify operation in the higher state is a total number of memory cells reaching the verify level of the lower state in the current loop and the all previous loops (based on the value of the vertical axis of FIG. 14A), the verify-read operation in the higher state easily starts in the write loop of an unnecessarily early stage unless the threshold (equivalent to Ct) of the number of memory cells is large. Accordingly, compared to the verify-skip operation of the embodiment, the number of write states in which the verify-read operation is executed increases in each write loop and it becomes difficult to execute the verify-skip operation. Thus, a write time becomes longer and a speed of the write operation decreases. On the other hand, when the threshold of the number of memory cells is large, the start of the verify-read operation in the higher state may become excessively late. When the verify-read operation in the higher state starts in the excessively late write loop, the number of memory cells already reaching the verify level of the higher state becomes large before the start of the verify-read operation in the higher state. When the number of memory cells already reaching the threshold voltage in the higher state is large, the memory cells in which the higher state is written may considerably exceed the verify level of the higher state and the upper portion of the threshold distribution in the higher state is widened. Accordingly, the threshold distribution of the memory cells in the higher state is widened and reliability of the write operation deteriorates.

In the embodiment, it is simultaneously prevented the verify-read operation in the higher state from starting in the write loop of an unnecessarily early stage and from starting in the write loop of an excessively late stage.

According to the above-described embodiment, it is possible to realize the semiconductor memory device in which a speed and reliability of the write operation are improved.

In the embodiment, the example in which the above-described write operation is applied to a 2-dimensional NAND EEPROM has been described. The write operation may be applied to a 3-dimensional NAND EEPROM.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device comprising:
   a plurality of word lines;
   a plurality of bit lines;
   a plurality of memory cells provided to correspond to intersections of the word lines and the bit lines;
   a word line driving circuit that applies a voltage to a selected word line among the plurality of word lines;
   a sense amplifier circuit that detects data of the memory cells; and
   a controller that controls the word line driving circuit and the sense amplifier circuit,
   the memory cell connected to the selected word line being written with data using a write sequence including a plurality of write loops each including a write operation of applying a write voltage to the selected word line by the word line driving circuit and a verify operation of detecting data of the memory cell by the sense amplifier circuit, and
   the controller determining an (n+k)-th (where n is an integer not less than 1 and k is an integer not less than 2) verify operation based on comparison between an n-th verify operation and an (n+1)-th verify operation in the write sequence.

2. The device according to claim 1,
   wherein the verify operation is executed based on a plurality of different verify levels of threshold voltages,
   the controller executes the n-th and (n+1)-th verify operations at a first verify level of the threshold voltage, and
   based on comparison between the n-th and (n+1)-th verify operations of the first verify level of the threshold voltage, the controller determines whether the (n+k)-th verify operation at a second verify level of the threshold voltage is executed or omitted.

3. The device according to claim 2,
   wherein the second verify level of the threshold voltage is a verify level higher by one or two stages or more than the first verify level of the threshold voltage in the plurality of verify levels of threshold voltages.

4. The device according to claim 2,
   wherein based on a difference between the number of memory cells passing the n-th verify operation at the first verify level of the threshold voltage and the number of memory cells passing the (n+1)-th verify operation at the first verify level of the threshold voltage, the controller determines whether the (n+k)-th verify operation at the second verify level of the threshold voltage is executed or omitted.

5. The device according to claim 2, wherein when a difference between the number of memory cells passing the n-th verify operation at the first verify level of the threshold voltage and the number of memory cells passing the (n+1)-th verify operation at the first verify level of the threshold voltage is not less than a threshold of the number of memory cells, the controller executes the (n+k)-th verify operation at the second verify level of the threshold voltage.

6. The device according to claim 2, wherein when a difference between the number of memory cells passing the n-th verify operation at the first verify level of the threshold voltage and the number of memory cells passing the (n+1)-th verify operation at the first verify level of the threshold voltage is 1.0 or more percents of the memory cells connected to the selected word line, the controller executes the (n+k)-th verify operation at the second verify level of the threshold voltage.

7. The device according to claim 2, wherein the write sequence includes a first write sequence and a second write sequence different from the first write sequence in a distribution of the threshold voltage after the first write sequence is executed, and based on comparison between the n-th and (n+1)-th verify operations of the first verify level of the threshold voltage in the verify operation of the second write sequence, the controller determines whether the (n+k)-th verify operation of the second verify level of the threshold voltage is executed or omitted.

8. The device according to claim 2, wherein the verify operation is executed based on three or more different verify levels of threshold voltages, and when the (n+k)-th verify operation at the second verify level of the threshold voltage is executed, the controller omits the verify operation at the verify levels excluding the first and second verify levels of the threshold voltages.

9. A semiconductor memory device comprising:
a plurality of word lines;
a plurality of bit lines;
a plurality of memory cells provided to correspond to intersections of the word lines and the bit lines;
a word line driving circuit that applies a voltage to a selected word line among the plurality of word lines;
a sense amplifier circuit that detects data of the memory cells; and
a controller that controls the word line driving circuit and the sense amplifier circuit,
the memory cell connected to the selected word line being written with data using a write sequence including a plurality of write loops each including a write operation of applying a write voltage to the selected word line by the word line driving circuit and a verify operation of detecting data of the memory cell by the sense amplifier circuit, the controller executing n-th and (n+1)-th (where n is an integer not less than 1) verify operations at a first verify level of a threshold voltage in the write sequence, and
based on a difference between the number of memory cells passing the n-th verify operation at the first verify level of the threshold voltage and the number of memory cells passing the (n+1)-th verify operation at the first verify level of the threshold voltage, the controller determining whether the (n+k)-th verify operation (where k is an integer not less than 2) at a second verify level of the threshold voltage which is a verify level higher than the first verify level of the threshold voltage is executed or omitted.

10. The device according to claim 9, wherein the second verify level of the threshold voltage is a verify level higher by one or two stages or more than the first verify level of the threshold voltage in the three or more different verify levels of threshold voltages.

11. The device according to claim 9, wherein when a difference between the number of memory cells passing the n-th verify operation at the first verify level of the threshold voltage and the number of memory cells passing the (n+1)-th verify operation at the first verify level of the threshold voltage is not less than a threshold of the number of memory cells, the controller executes the (n+k)-th verify operation at the second verify level of the threshold voltage.

12. The device according to claim 9, wherein when a difference between the number of memory cells passing the n-th verify operation at the first verify level of the threshold voltage and the number of memory cells passing the (n+1)-th verify operation at the first verify level of the threshold voltage is 1.0 or more percents of the memory cells connected to the selected word line, the controller executes the (n+k)-th verify operation at the second verify level of the threshold voltage.

13. The device according to claim 9, wherein the write sequence includes a first write sequence and a second write sequence different from the first write sequence in a distribution of the threshold voltage after the first write sequence is executed,
the controller executes the n-th and (n+1)-th verify operations at the first verify level of the threshold voltage in the verify operation of the second write sequence, and
based on a difference between the number of memory cells passing the n-th verify operation at the first verify level of the threshold voltage and the number of memory cells passing the (n+1)-th verify operation at the first verify level of the threshold voltage, the controller determines whether the (n+k)-th verify operation at the second verify level of the threshold voltage which is a verify level higher than the first verify level of the threshold voltage is executed or omitted.

14. The device according to claim 9, wherein the verify operation is executed based on three or more different verify levels of threshold voltages, and when the (n+k)-th verify operation at the second verify level of the threshold voltage is executed, the controller omits the verify operation at the verify levels excluding the first and second verify levels of the threshold voltage.

* * * * *